United States Patent
Tomita et al.

(10) Patent No.: US 9,530,881 B2
(45) Date of Patent: Dec. 27, 2016

(54) SEMICONDUCTOR DEVICE, AND METHOD OF MANUFACTURING THE SAME

(71) Applicant: KABUSHIKI KAISHA TOSHIBA, Tokyo (JP)

(72) Inventors: Kouta Tomita, Nonoichi Ishikawa (JP); Kenji Maeyama, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,888

(22) Filed: Mar. 1, 2015

(65) Prior Publication Data

US 2016/0079412 A1 Mar. 17, 2016

(30) Foreign Application Priority Data

Sep. 16, 2014 (JP) ................................. 2014-187750

(51) Int. Cl.
*H01L 29/66* (2006.01)
*H01L 23/48* (2006.01)
(Continued)

(52) U.S. Cl.
CPC ........ *H01L 29/7813* (2013.01); *H01L 21/3065* (2013.01); *H01L 29/0684* (2013.01);
(Continued)

(58) Field of Classification Search
CPC .......... H01L 29/7813; H01L 21/30604; H01L 29/0684; H01L 29/0882; H01L 29/36; H01L 29/41741; H01L 29/41766; H01L 29/417; H01L 29/47; H01L 29/872; H01L 21/3065; H01L 29/781
(Continued)

(56) References Cited

U.S. PATENT DOCUMENTS 4,754,310 A * 6/1988 Coe ..................... H01L 29/0634
257/287
6,222,233 B1 * 4/2001 D'Anna ............. H01L 29/0653
257/343

(Continued)

FOREIGN PATENT DOCUMENTS

JP H05275628 10/1993
JP H08306733 A 11/1996
(Continued)

*Primary Examiner* — Dzung Tran
(74) *Attorney, Agent, or Firm* — Patterson & Sheridan, LLP (57) ABSTRACT

A semiconductor device includes a first-conductive-type first semiconductor layer having a first surface and an opposing second surface. A first-conductive-type second semiconductor layer is on the first surface, and a second-conductive-type third semiconductor layer is on the second semiconductor layer. A first-conductive-type fourth semiconductor layer is on the third semiconductor layer. A first electrode is provided on the second semiconductor layer, the third semiconductor layer, and the fourth semiconductor layer via an insulating film. A second electrode is on the fourth semiconductor layer. A third electrode is separated from the second electrode in a second direction. The third electrode has a width in the second direction, and the width of the third electrode narrows from a first depth to a second depth. An angle of the side surface of the second semiconductor layer is greater than or equal to 90 degrees.

17 Claims, 10 Drawing Sheets

(51) Int. Cl.
*H01L 21/336* (2006.01)
*H01L 29/78* (2006.01)
*H01L 29/417* (2006.01)
*H01L 29/06* (2006.01)
*H01L 29/08* (2006.01)
*H01L 29/36* (2006.01)
*H01L 21/3065* (2006.01)

(52) U.S. Cl.
CPC .......... *H01L 29/0882* (2013.01); *H01L 29/36* (2013.01); *H01L 29/41741* (2013.01); *H01L 29/41766* (2013.01); *H01L 29/66734* (2013.01); *H01L 29/781* (2013.01)

(58) Field of Classification Search
USPC ............ 257/330, E21.41, 737; 438/270, 272
See application file for complete search history.

(56) References Cited

U.S. PATENT DOCUMENTS

| | | | | |
|---|---|---|---|---|
| 2005/0093060 | A1* | 5/2005 | Murakami | H01L 29/41766 257/330 |
| 2006/0030142 | A1* | 2/2006 | Grebs | H01L 29/0653 438/618 |
| 2008/0035987 | A1* | 2/2008 | Hebert | H01L 21/26586 257/330 |
| 2011/0127606 | A1* | 6/2011 | Bobde | H01L 27/0705 257/337 |
| 2012/0068231 | A1* | 3/2012 | Garnett | H01L 29/41766 257/263 |

FOREIGN PATENT DOCUMENTS

| | | |
|---|---|---|
| JP | 2010-278344 A | 12/2010 |
| JP | 2013042071 | 2/2013 |

* cited by examiner

SEMICONDUCTOR DEVICE, AND METHOD OF MANUFACTURING THE SAME

CROSS-REFERENCE TO RELATED APPLICATION

This application is based upon and claims the benefit of priority from Japanese Patent Application No. 2014-187750, filed Sep. 16, 2014, the entire contents of which are incorporated herein by reference.

FIELD

Embodiments described herein relate generally to a semiconductor device and a method of manufacturing the semiconductor device.

BACKGROUND

In a semiconductor device such as a metal oxide semiconductor field effect transistor (MOSFET), a source electrode and a drain electrode can be provided on an upper side of a semiconductor substrate in some cases. In this type of semiconductor device, the source electrode is provided over a source region and the drain electrode is formed in parallel with the source electrode. A part of the drain electrode can be provided in the semiconductor substrate.

Techniques for reducing on-state resistance between the source electrode and the drain electrode include a method of removing a high-resistance drift layer from a region in which the drain electrode is formed. In this method, a trench that reaches a drain region is formed in a drift region, for example, with isotropic etching, and the drain electrode is formed in the trench.

However, in the trench formed by the isotropic etching, an inner wall of the trench typically has a curved surface. Accordingly, a semiconductor layer in the vicinity of an opening of the trench may have a sharp eave-like feature at the upper surface of the substrate. When forming the drain electrode in the trench thus formed, a local stress may be applied to the sharp eave-like portion due to a difference between a coefficient of thermal expansion of the drain electrode and a coefficient of thermal expansion of a semiconductor material, or due to an inner stress of the drain electrode. Therefore, the sharp portion may be damaged and/or peeling may occur between the sharp portion and the drain electrode.

DETAILED DESCRIPTION

In general, according to one embodiment, a semiconductor device includes: a first semiconductor layer of a first conductivity type having a first surface and an opposing second surface, where a direction from the first surface to the second surface is a first direction; a second semiconductor layer of the first conductivity type provided on the first surface of the first semiconductor layer; a third semiconductor layer of a second conductivity type provided on the second semiconductor layer; a fourth semiconductor layer of the first conductivity type provided on the third semiconductor layer; a first electrode provided on the second semiconductor layer, the third semiconductor layer, and the fourth semiconductor layer via an insulating film; a second electrode provided on the fourth semiconductor layer; and a third electrode separated from the second electrode in a second direction perpendicular to the first direction. One surface of the third electrode contacts the first surface of the first semiconductor layer, and another surface of the third electrode contacts a side surface of the second semiconductor layer. The third electrode has a width in the second direction, and the width of the third electrode narrows in the first direction from a first depth to a second depth. And an angle of the side surface of the second semiconductor layer with respect to the first surface of the first semiconductor layer is greater than or equal to 90 degrees.

Hereinafter, example embodiments will be described with reference to the accompanying drawings.

In the present disclosure, the same or substantially similar elements described previously with respect to a drawing are given the same reference numerals, and detailed descriptions of these elements described with respect to an earlier drawing may be omitted with respect to descriptions of subsequent drawings.

(First Embodiment)

Figure 1A:
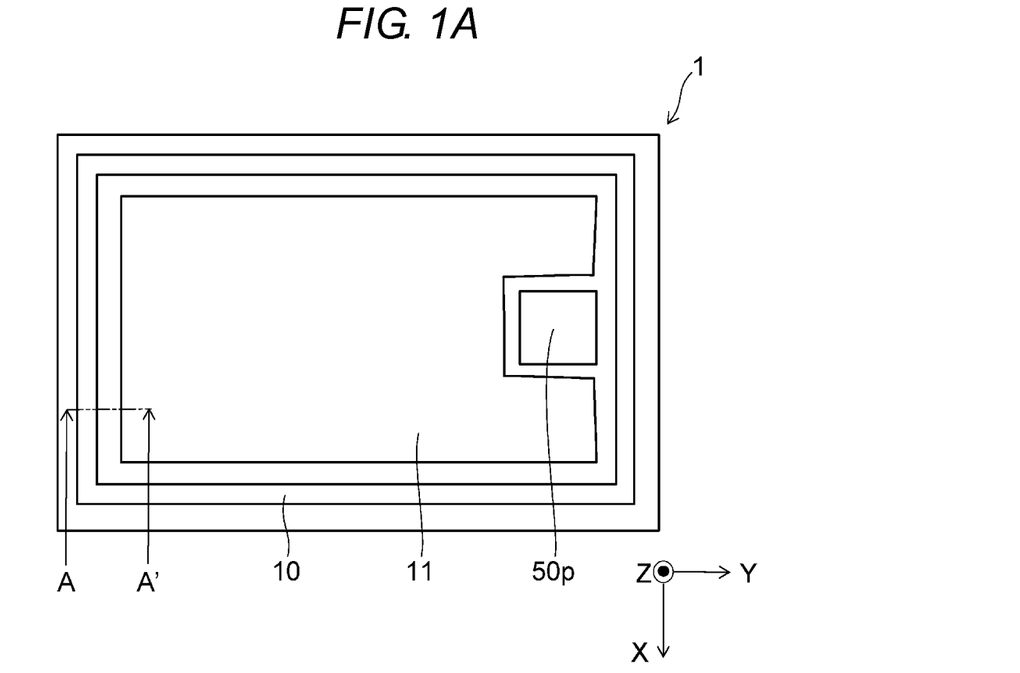
FIG. 1A is a schematic plan view illustrating a semiconductor device according to a first embodiment.
Figure 1B:
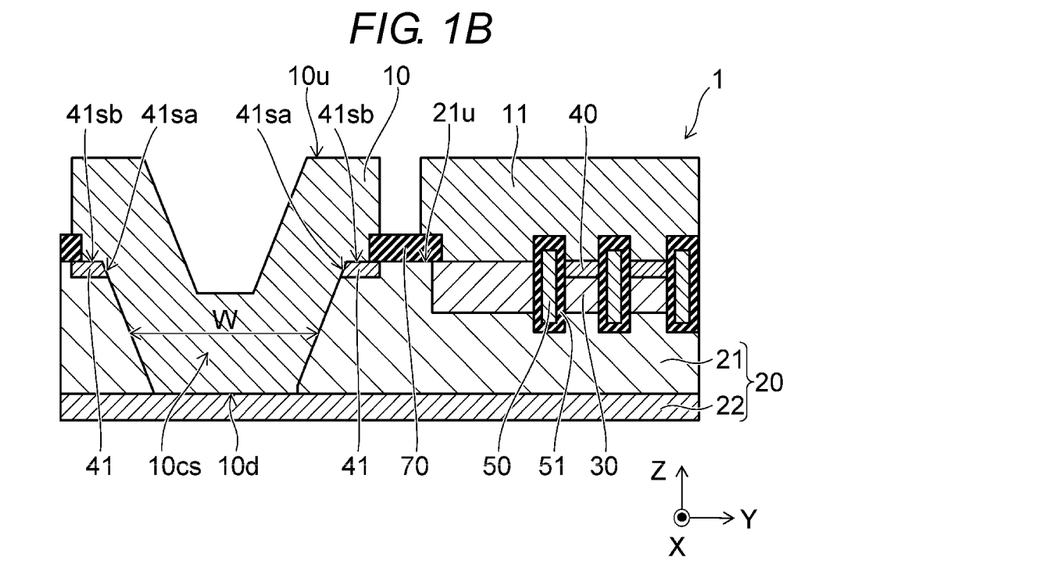
FIG. 1B is a schematic cross-sectional view illustrating a part of the semiconductor device according to the first embodiment.

FIG. 1A is a schematic plan view illustrating a semiconductor device according to a first embodiment, and FIG. 1B is a schematic cross-sectional view illustrating a part of the semiconductor device according to the first embodiment.

Here, FIG. 1B illustrates a cross-section taken along line A-A' in FIG. 1A.

The semiconductor device 1 according to the first embodiment is an up-drain type MOSFET in which a drain electrode 10 is provided on an upper surface side of the semiconductor device 1.

The semiconductor device 1 includes a first semiconductor layer (hereinafter, for example, a drain region 22), a second semiconductor layer (hereinafter, for example, a drift region 21), a third semiconductor layer (hereinafter, for example, a base region 30), a fourth semiconductor layer (hereinafter, for example, a source region 40), a gate insulating film 51, a first electrode (hereinafter, for example, a gate electrode 50), a second electrode (hereinafter, for example, a source electrode 11), a third electrode (hereinafter, for example, a drain electrode 10), and a fifth semiconductor layer (hereinafter, for example, an n$^+$ semiconductor region 41).

In this first embodiment, the semiconductor region 20 is defined to include the drain region 22 and the drift region 21. Here, the drift region 21 is provided on an upper side of the drain region 22. A conductive type of the drift region 21 is an n-type. A conductive type of the drain region 22 is an n$^+$-type. An impurity concentration of the drain region 22 is higher than an impurity concentration of the drift region 21.

The base region 30 is selectively provided on the drift region 21. A conductive type of the base region 30 is a p-type. The source region 40 is selectively provided on the base region 30. A conductive type of the source region 40 is an n$^+$-type. The gate electrode 50 is provided in the drift region 21, the base region 30, and the source region 40 via the gate insulating film 51. The gate electrode 50 having the trench gate structure extends, for example, in an X-direction in FIGS. 1A and 1B.

The source electrode 11 is provided on the source region 40. The source electrode 11 is electrically connected to the source region 40. The drain electrode 10 is disposed to be separated from the source electrode 11. A lower end 10$d$ of the drain electrode 10 is located in the semiconductor region 20. That is, the drain electrode 10 extends in a direction orthogonal to a layer plane of the semiconductor region 20, such that lower end 10$d$ is below, as depicted in FIG. 1B, an upper surface (surface on which source electrode 11 is disposed, such as surface 21$u$) of the semiconductor region 20. One end (for example, the lower end 10$d$) of the drain electrode 10 comes into contact with the drain region 22. On the other hand, portions, such as upper portion 10$u$, of the drain electrode are located above the lower end 10$d$ and are contact a surface 21$u$ side of the drift region 21.

In the drain electrode 10, a width on the portions above the lower end 10$d$ is set to be wider than a width on the lower end 10$d$. For example, in a cross section 10$cs$ obtained by cutting out the drain electrode 10 in a direction parallel with a direction in which the drain electrode 10 and the source electrode 11 are disposed (for example, a Y-direction illustrated in FIG. 1A), when going toward the lower end 10$d$, a width W of at least a part of the cross section 10$cs$ gradually decreases. Here, "width" represents a width of the drain electrode 10 when the drain electrode 10 is cut in a direction perpendicular to a direction in which the drain electrode 10 extends in the depth direction (Z-axis). For example, a shape of the cross section 10$cs$ of the drain electrode 10 provided in the semiconductor region 20 is a forward taper shape that becomes narrower when going toward the lower end 10$d$ (along the Z-axis towards drain region 22).

The n$^+$ semiconductor region 41 is selectively provided on the drift region 21. The n$^+$ semiconductor region 41 is selectively provided on the drift region 21 in which the base region 30 is not provided. The drain electrode 10 is connected to the semiconductor region 20 (e.g., the drift layer 21) and the n$^+$ semiconductor region 41.

The n$^+$ semiconductor region 41 has a first surface 41$sa$ that comes into contact with the drain electrode 10, and a second surface 41$sb$ that comes into contact with the drain electrode 10 and intersects the first surface 41$sa$. An angle formed by the first surface 41$sa$ and the second surface 41$sb$ is a right angle or an obtuse angle. FIG. 1B illustrates an example in which the angle formed by the first surface 41$sa$ and the second surface 41$sb$ is an obtuse angle. For example, the n$^+$ semiconductor region 41 comes into ohmic contact with the drain electrode 10.

The depth of the n$^+$ semiconductor region 41 is the same as the depth of the source region 40. An impurity concentration of the n$^+$ semiconductor region 41 is the same as an impurity concentration of the source region 40.

An impurity concentration of a semiconductor region including the n$^+$ semiconductor region 41 and the drift region 21 continuously decrease in a direction (for example, a Z-direction) perpendicular to the directions (for example, the X-direction or the Y-direction) in which the source electrode 11 and the drain electrode 10 are disposed.

In this first embodiment, with regard to an impurity concentration profile, a region having an impurity concentration of $1 \times 10^{17}$ (atoms/cm$^3$) or more is set as the drain region 22, and a region having an impurity concentration of less than $1 \times 10^{17}$ (atoms/cm$^3$) is set as the drift region 21, as an example. The impurity concentration of the n$^+$ semiconductor region 41 is higher than the impurity concentration of the drift region 21. However, the impurity concentration that determines a boundary between the drain region 22 and the drift region 21 is not limited to any specific concentration.

The base region 30, the source region 40, and the gate electrode 50 via gate insulating film 51 are located on a lower side of the source electrode 11 in FIG. 1A. An interlayer insulating film 70 is provided on the semiconductor region 20. The interlayer insulating film 70 is provided between the source electrode 11 and the semiconductor region 20, and between the drain electrode 10 and the semiconductor region 20.

In addition, as depicted in FIG. 1A and FIG. 1B, the drain electrode 10 surrounds the base region 30, the source region 40, and the gate electrode 50 in an X-Y plane. Similarly, the n$^+$ semiconductor region 41 surrounds the base region 30, the source region 40, and the gate electrode 50 in an X-Y plane. In addition, a gate pad 50$p$ is electrically connected to the gate electrode 50.

The semiconductor regions 20, 30, and 40 according to this first embodiment include, for example, silicon (Si), silicon carbide (SiC), gallium arsenide (GaAs), and the like. The drain electrode 10, the source electrode 11, and the gate pad 50$p$ can include a metal selected from aluminum (Al), nickel (Ni), copper (Cu), and titanium (Ti), or a conductive material such as polysilicon. A material of the gate electrode 50 includes a semiconductor (for example, polysilicon) to which an impurity element is introduced, or a metal (for example, tungsten). In addition, the "insulating films" used in this embodiment include silicon oxide (SiO$_x$), such as silicon dioxide, silicon nitride (SiN$_x$), and the like.

In this first embodiment, the n$^+$-type and the n-type may be set as "first conductive type", and the p-type may be set as "second conductive type". Examples of the n$^+$-type and n-type impurity elements include phosphorous (P), arsenic (As), and the like. Examples of the p-type impurity element include boron (B), and the like.

A process of manufacturing the semiconductor device 1 according to the first embodiment will be described next.

FIG. 2A to FIG. 6B are schematic cross-sectional views illustrating a process of manufacturing the semiconductor device 1 according to the first embodiment.

FIG. 2A to FIG. 6B illustrate schematic cross-section corresponding to a position of line A-A' in FIG. 1A.

Figure 2A:
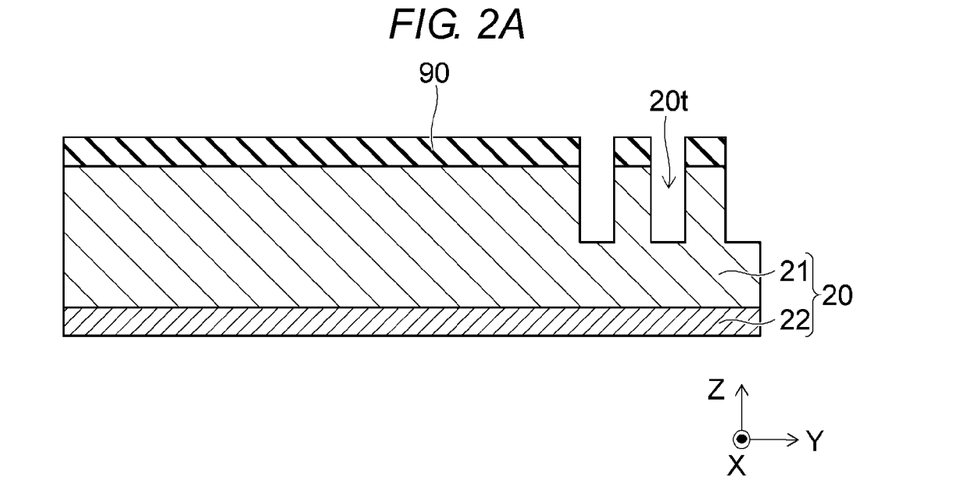
FIGS. 2A and 2B are schematic cross-sectional views illustrating a process of manufacturing the semiconductor device according to the first embodiment.

As illustrated in FIG. 2A, a mask layer 90 is patterned on the semiconductor region 20 (on drift region 21 side of the semiconductor region 20). Subsequently, reactive ion etching (RIE) is performed with respect to the portions of drift region 21 that are exposed from the mask layer 90 to form a first trench (hereinafter, for example, a trench 20t) in the drift region 21. Then, the mask layer 90 is removed.

Figure 2B:
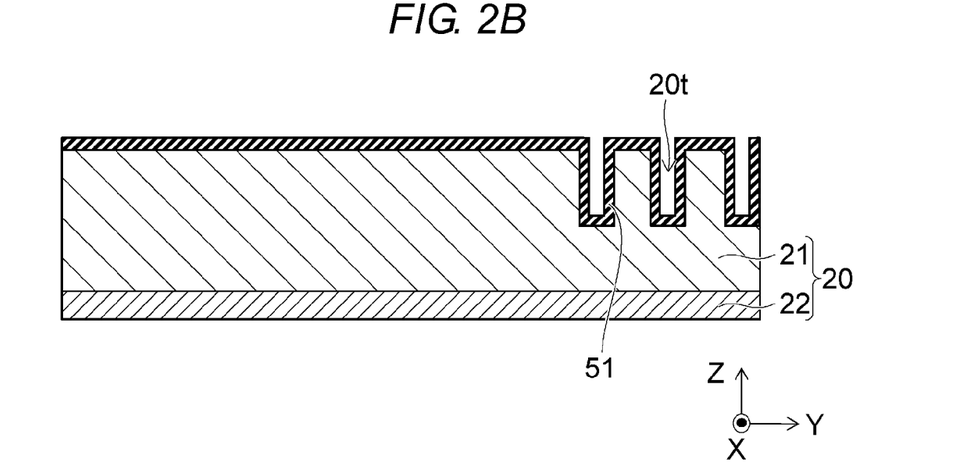

Next, as illustrated in FIG. 2B, the gate insulating film 51 is formed on an inner wall of the trench 20t and on the drift region 21 by chemical vapor deposition (CVD), atomic layer deposition (ALD), or the like.

Figure 3A:
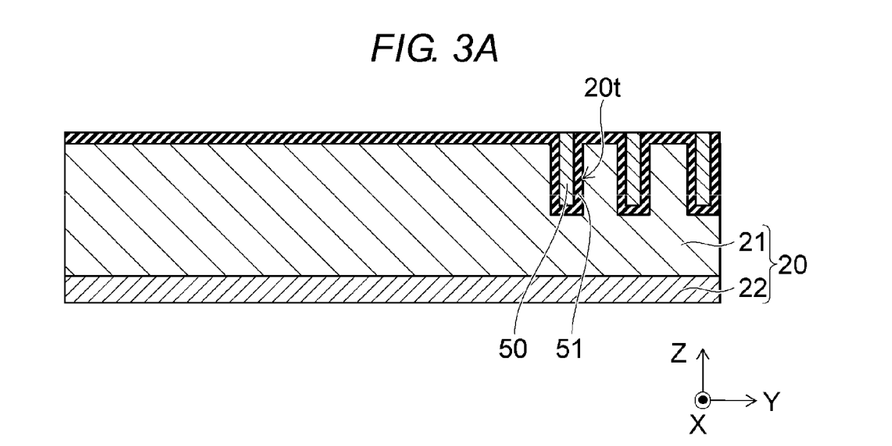
FIGS. 3A and 3B are schematic cross-sectional views illustrating a process of manufacturing the semiconductor device according to the first embodiment.

Next, as illustrated in FIG. 3A, the gate electrode 50 is formed in the trench 20t over the gate insulating film 51.

Figure 3B:
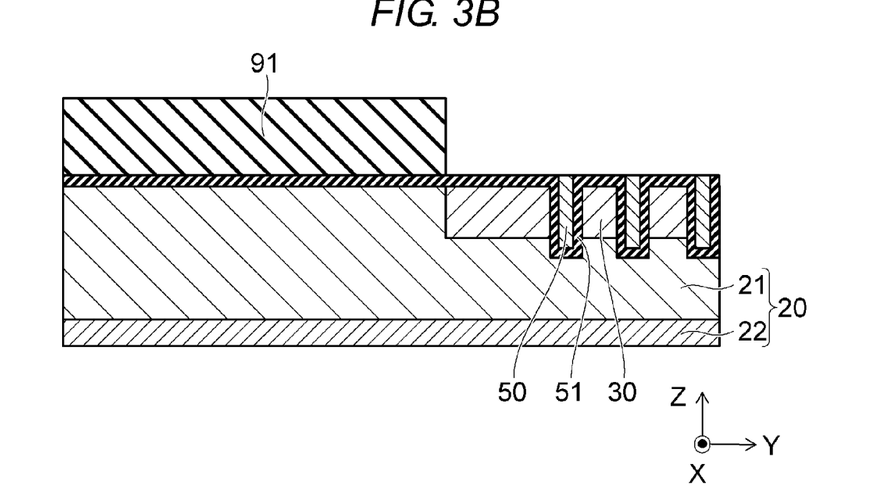

Next, as illustrated in FIG. 3B, a mask layer 91 is patterned on the drift region 21 on areas in which the gate electrode 50 is not provided. Subsequently, p-type impurity elements are ion-implanted on a surface layer of the drift region 21 exposed from the mask layer 91. Then, an annealing treatment is performed. According to this process, the base region 30 is selectively formed on the surface layer of the drift region 21. The base region 30 contacts the gate insulating film 51. The mask layer 91 is removed.

Figure 4A:
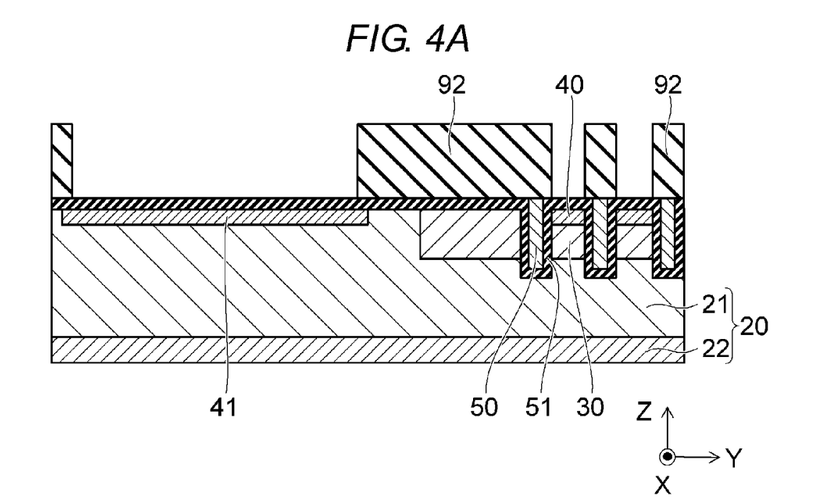
FIGS. 4A and 4B are schematic cross-sectional views illustrating a process of manufacturing the semiconductor device according to the first embodiment.

Next, as illustrated in FIG. 4A, a mask layer 92 is patterned so as expose the base region 30 between the gate electrodes 50 that are adjacent to each other, and also expose the drift region 21 in which the base region 30 has not been provided. Subsequently, n-type impurity elements are ion-implanted on a surface layer of the base region 30 that is not covered with the mask layer 92, and the surface layer of the drift region 21 that is not covered with the mask layer 92. Then, an annealing treatment is performed.

According to this process, the source region 40 is formed on the surface layer of the base region 30. The base region 30 contacts the gate insulating film 51. When the source region 40 is formed, the n$^+$ semiconductor region 41 is also selectively formed on the surface layer of the drift region 21. The n$^+$ semiconductor region 41 is selectively formed on the surface layer of the drift region 21 in which the base region 30 is not provided. Then, the mask layer 92 is removed.

Figure 4B:
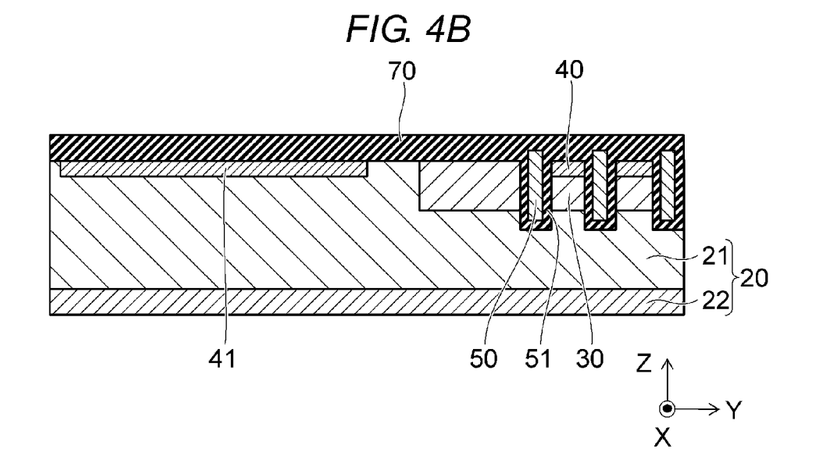

Next, as illustrated in FIG. 4B, an insulating film is laminated on the n$^+$ semiconductor region 41, on the drift region 21, and on the gate insulating film 51 provided on the source region 40 to form an interlayer insulating film 70 in which the insulating film and the gate insulating film 51 are joined together.

Figure 5A:
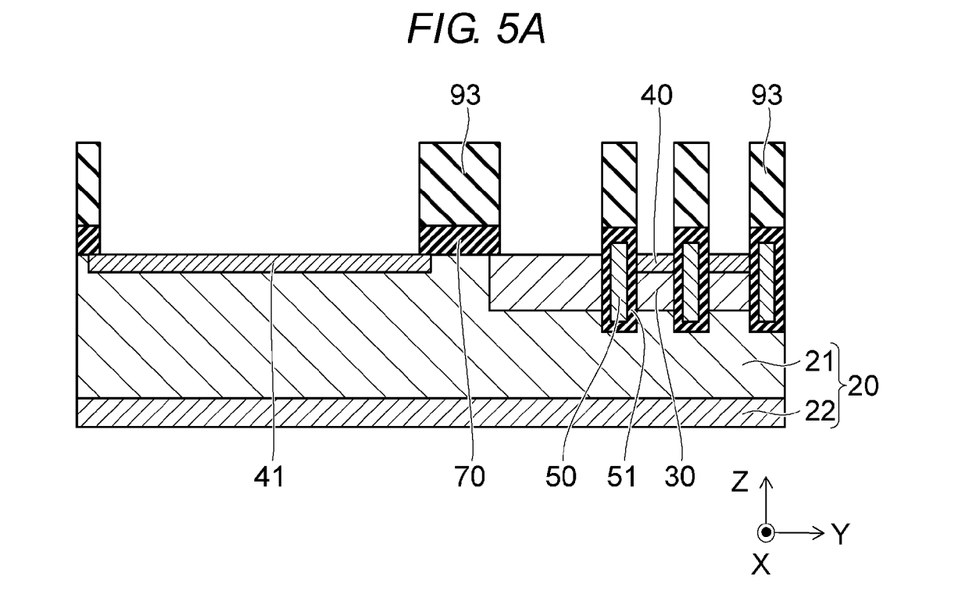
FIGS. 5A and 5B are schematic cross-sectional views illustrating a process of manufacturing the semiconductor device according to the first embodiment.

Next, as illustrated in FIG. 5A, a mask layer 93 is patterned so as not to cover the source region 40, a part of the base region 30 which is adjacent to the source region 40, and a part of the n$^+$ semiconductor region 41. Subsequently, the interlayer insulating film 70 that is exposed from the mask layer 93 is removed with RIE. The areas of the interlayer insulating film 70 contacting the gate insulating film 51 are now considered part of the gate insulating film 51.

Figure 5B:
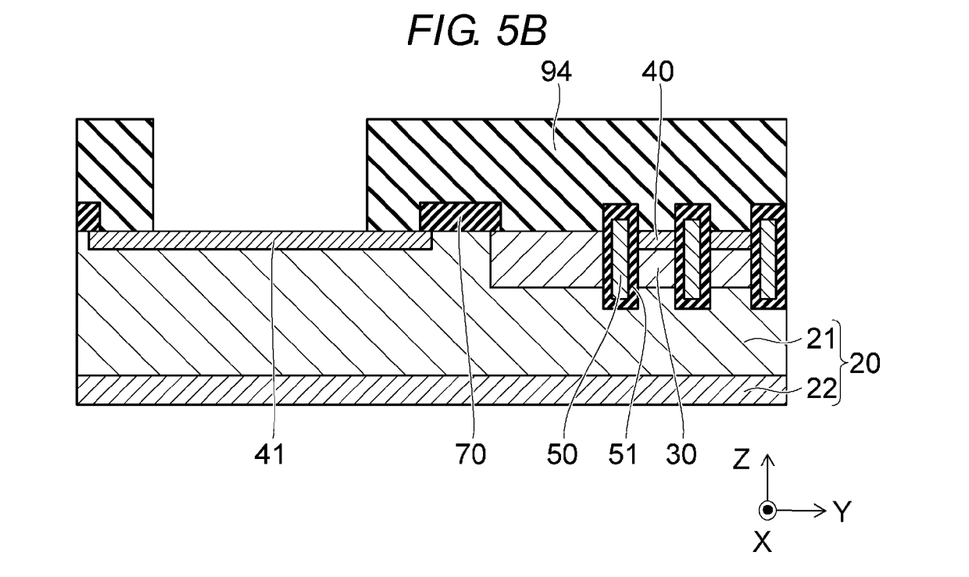

Next, as illustrated in FIG. 5B, a mask layer 94, from which a part of the n$^+$ semiconductor region 41 is exposed, is patterned.

Figure 6A:
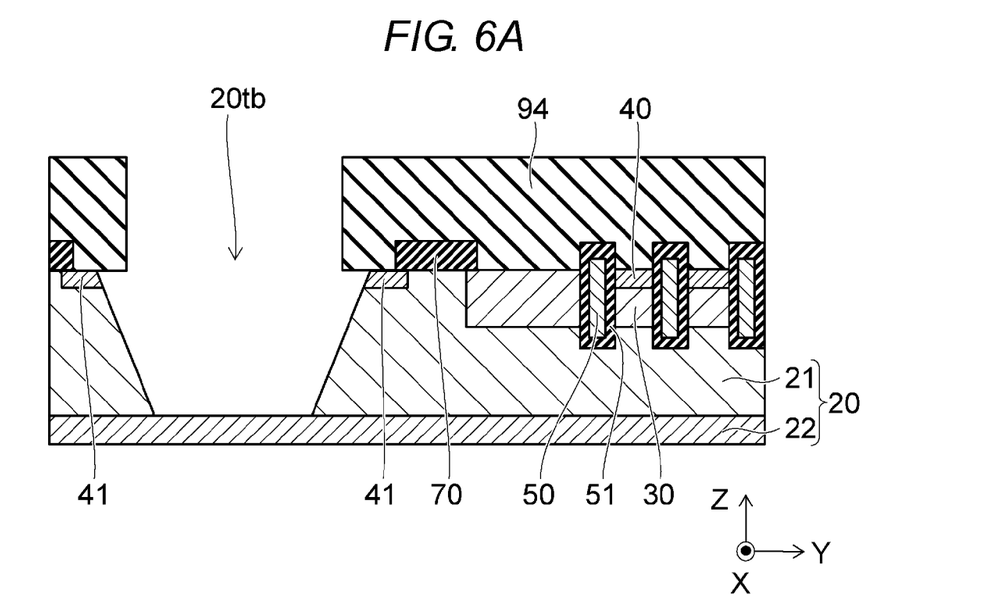
FIGS. 6A and 6B are schematic cross-sectional views illustrating a process of manufacturing the semiconductor device according to the first embodiment.

Next, as illustrated in FIG. 6A, the n$^+$ semiconductor region 41 that is exposed from the mask layer 94, and the drift region 21 below the n$^+$ semiconductor region 41 that is exposed from the mask layer 94 are etched with isotropic etching. According to this, a second trench (hereinafter, referred to as a trench 20tb) is formed in the drift region 21.

Here, an impurity concentration of a region including the n$^+$ semiconductor region 41 and the drift region 21 continuously decreases in a direction (for example, the Z-direction) perpendicular to the directions (for example, the X-direction or the Y-direction) in which the source electrode 11 and the drain electrode 10 are disposed.

Accordingly, when the n$^+$ semiconductor region 41 that is exposed from the mask layer 94, and the drift region 21, which is exposed from the mask layer 94, below the n$^+$ semiconductor region 41 are etched with isotropic etching, a trench 20tb having a forward taper shape is formed. Formation of the trench 20tb will be described later in detail.

Figure 6B:
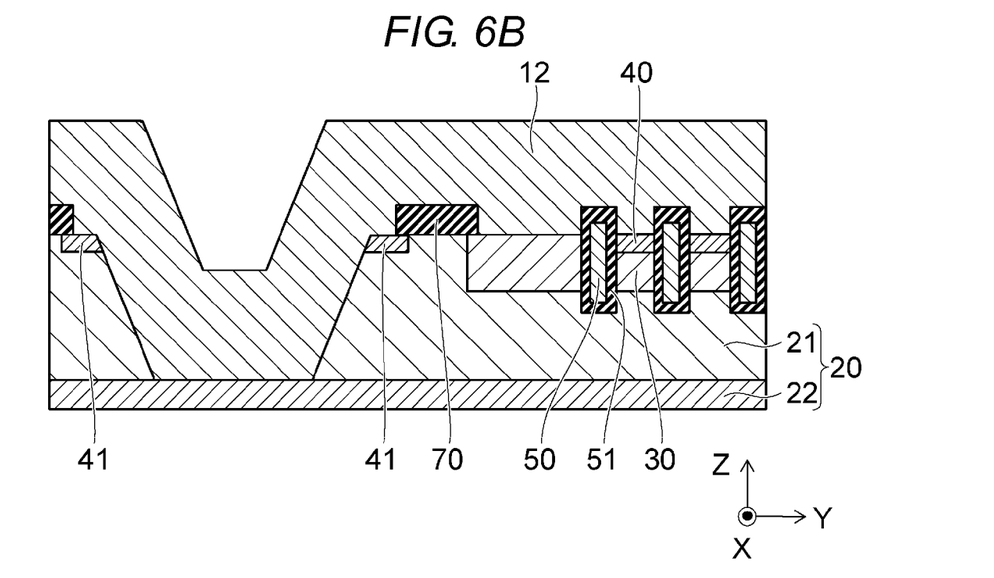

Next, as illustrated in FIG. 6B, an electrode layer 12 is formed in the trench 20tb, on the n$^+$ semiconductor region 41, on the interlayer insulating film 70, on the base region 30, on the source region 40, and on the gate insulating film 51. A material of the electrode layer 12 is the same as a material of the source electrode 11 or a material of the drain electrode 10.

Then, the electrode layer 12 is divided with RIE to form the source electrode 11 and the drain electrode 10 as illustrated in FIG. 1B. The source electrode 11 is connected to the source region 40 on an upper side of the source region 40. The drain electrode 10 is formed in the trench 20tb and on the n$^+$ semiconductor region 41.

Figure 7A:
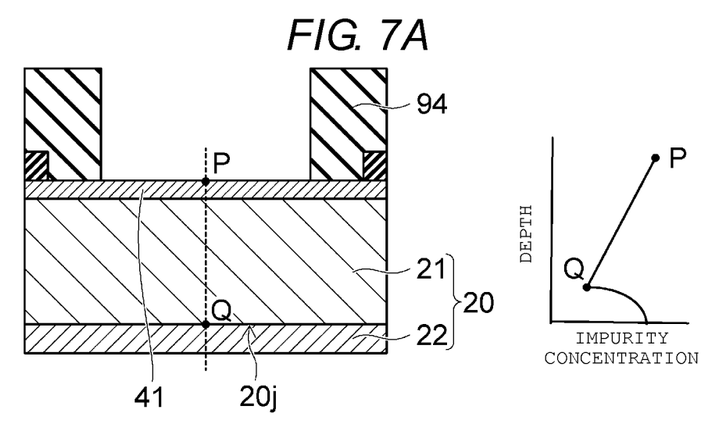
FIGS. 7A to 7C are schematic cross-sectional views illustrating isotropic etching according to the first embodiment in more detail.
Figure 7B:
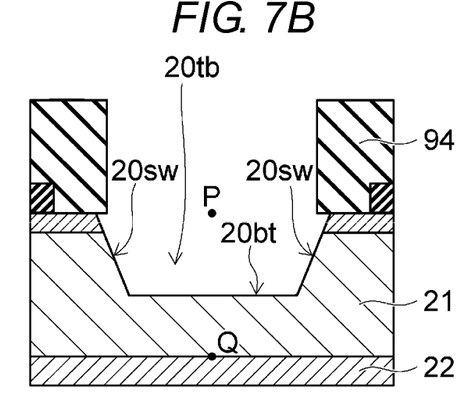
Figure 7C:
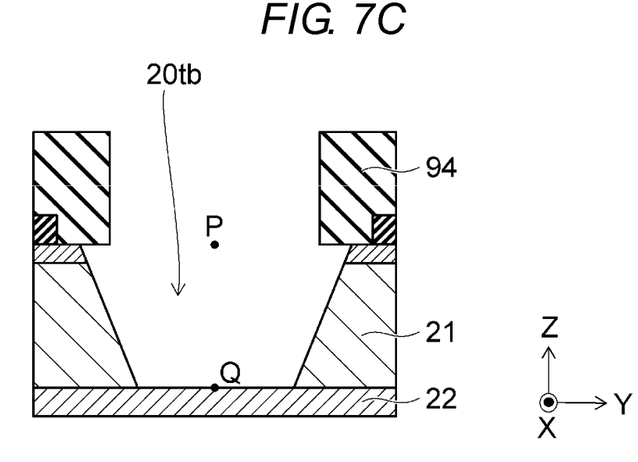

FIGS. 7A to 7C are schematic cross-sectional views illustrating the isotropic etching according to the first embodiment in more detail.

Examples of a gas that is used in the isotropic etching of the semiconductor layer including silicon (Si) include a fluorine-containing gas such as $SF_6$, $NF_6$, and $CF_4$, and a chlorine-containing gas such as $Cl_2$ and HCl, a bromine-containing gas such as HBr and $Br_2$, and the like.

Bonding energy between the halogen included in the gases and silicon is higher than bonding energy between silicon and silicon. That is, silicon is likely to react with halogen rather than silicon itself. Accordingly, a halogen-containing gas is used as an etching gas of the semiconductor layer including silicon.

In addition, the halogen has high electronegativity. Accordingly, halogen is likely to react with an electron-excessive material. For example, an n-type semiconductor layer, to which phosphorous (P) is implanted, more likely to react with a halogen-containing gas in comparison to a p-type semiconductor layer to which boron (B) is implanted. That is, the n-type semiconductor layer is more quickly etched by the halogen-containing gas in comparison to the p-type semiconductor layer. This is because more electrons are included in the n-type semiconductor layer than in the p-type semiconductor layer. In addition, even in the same n-type semiconductor layer, an n$^+$ semiconductor layer, which includes more n-type impurity elements than other n-type semiconductor layers, is more quickly etched with the halogen-containing gas in comparison to the other n-type semiconductor layers.

In the n$^+$ semiconductor region 41 and the drift region 21 according to the first embodiment as illustrated in FIG. 7A, an impurity concentration in a region including the n$^+$ semiconductor region 41 and the drift region 21 (region between a point P and a point Q) continuously decreases in the Z-direction as an example.

As illustrated in FIG. 7B, the isotropic etching is performed with respect to the above-described region, an etching rate of a bottom portion 20bt of the trench 20tb gradually decreases when approaching a position of the point Q. On the other hand, an etching rate of a side wall 20sw of the trench 20tb is faster at a position with a depth of the point P in comparison to a position with a depth of the point Q.

FIG. 7C illustrates a state in which the bottom portion 20bt of the trench 20tb reaches the drain region 22. In the first embodiment, when going toward the point Q from the point P, the trench 20*tb* having a forward taper shape, in which a width of the trench becomes narrower when going toward the point Q, is formed. Here, the "width" represents a width of the trench 20*tb* in a case where the trench 20*tb* is cut out (y direction in FIG. 7C) in a direction perpendicular to a direction in which the trench 20*tb* extends (x direction in FIG. 7C).

Figure 8A:
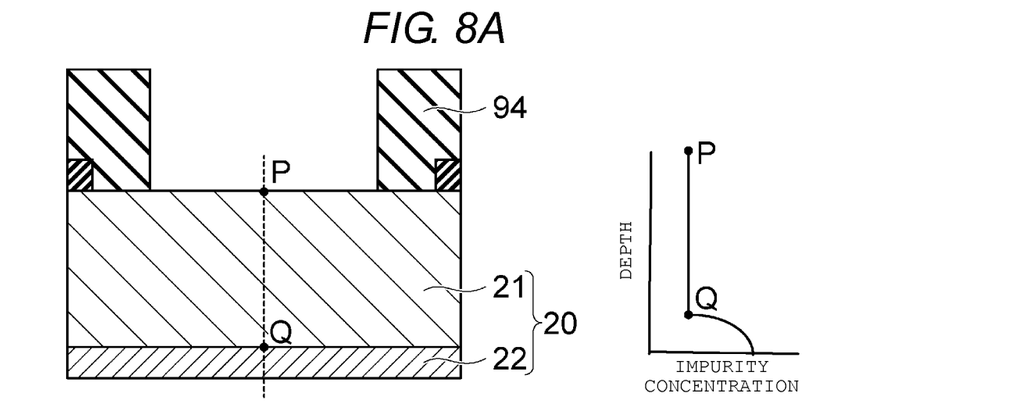
FIGS. 8A to 8C are schematic cross-sectional view illustrating isotropic etching according to a reference example.
Figure 8B:
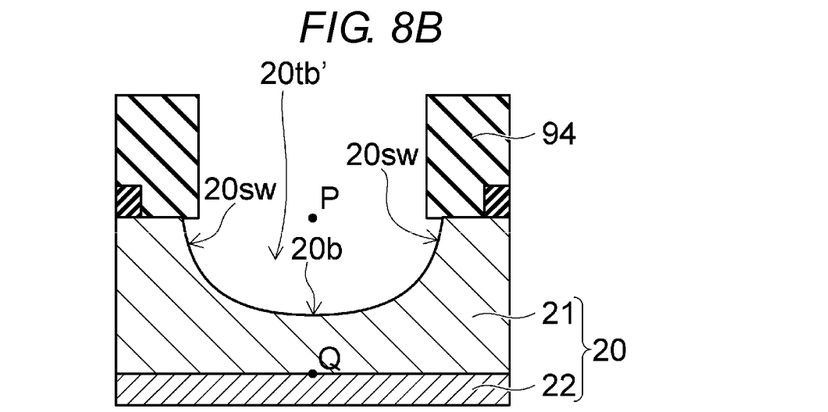
Figure 8C:
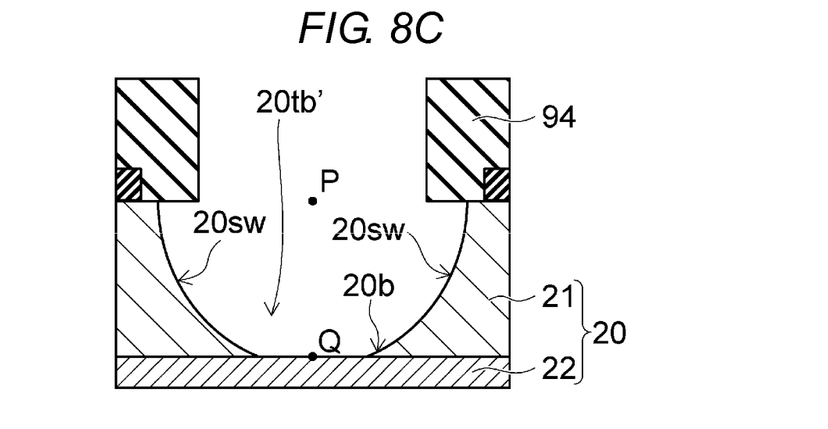

On the other hand, FIGS. 8A to 8C are schematic cross-sectional views illustrating isotropic etching relating to a reference example.

In the reference example illustrated in FIG. 8A, the $n^+$ semiconductor region 41 is not provided. In addition, an impurity concentration of the drift region 21 (a region between the point P and the point Q) is substantially the same in the Z-direction.

When the isotropic etching is performed with respect to the drift region 21 as illustrated in FIG. 8B, an etching rate becomes substantially the same at a bottom portion 20*b* and at a side wall 20*sw* of a trench 20*tb'*.

Accordingly, when the bottom portion 20*b* of the trench 20*tb'* reaches the drain region 22, as illustrated in FIG. 8C, the side wall 20*sw* of the trench 20*tb'* has a curved surface shape.

Next, an effect of the semiconductor device 1 according to the first embodiment will be described.

Figure 9A:
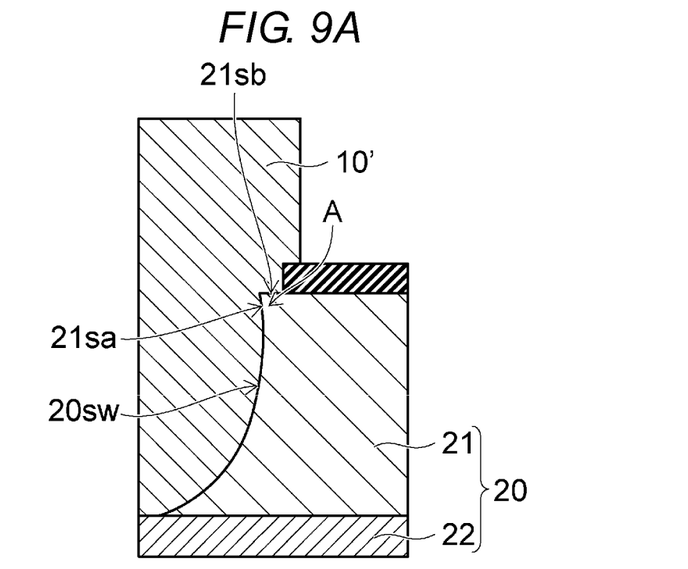
FIG. 9A is a schematic cross-sectional view illustrating a semiconductor device according to the reference example.
Figure 9B:
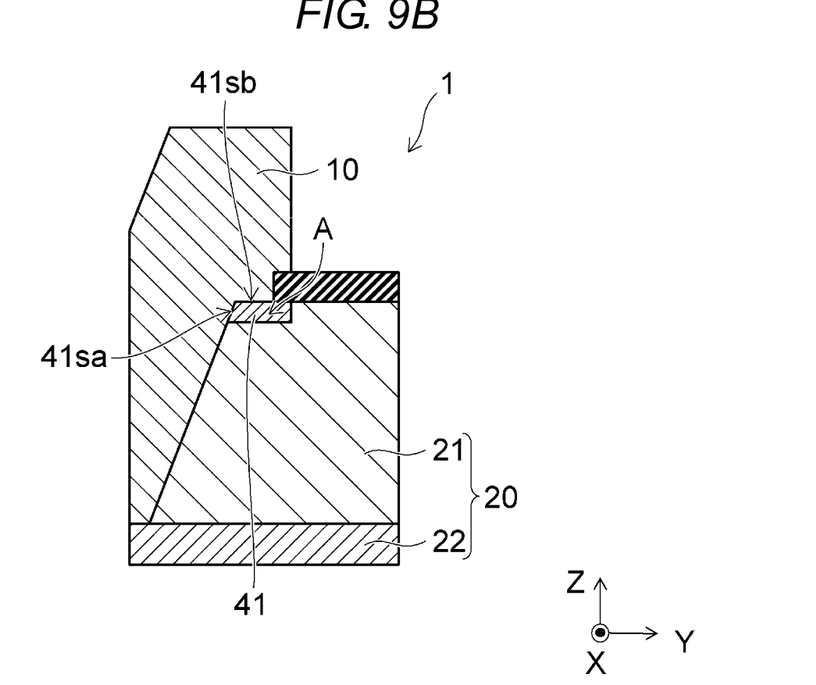
FIG. 9B is a schematic cross-sectional view illustrating the semiconductor device according to the first embodiment.

FIG. 9A is a schematic cross-sectional view illustrating a semiconductor device according to the reference example, and FIG. 9B is a schematic cross-sectional view illustrating a semiconductor device according to the first embodiment.

Here, in FIGS. 9A and 9B, enlarged views around the vicinity of the drain electrode are illustrated.

In the reference example illustrated in FIG. 9A, an angle formed by a surface 21*sa* in the vicinity of an upper end of the side wall 20*sw* of the drift region 21 that comes into contact with a drain electrode 10', and a surface 21*sb* that continues from the surface 21*sa* is an acute angle. A stress due to a thermal history or an inner stress (for example, a tensile stress) of the drain electrode 10', which is caused by a difference between a coefficient of thermal expansion of the drain electrode 10' and a coefficient of thermal expansion of the semiconductor material 20, is locally applied to a sharp portion (portion indicated by an arrow A') as illustrated. Therefore, around the sharp portion, a defect may occur, or peeling may occur between the sharp portion and the drain electrode 10'.

In contrast, an angle formed by the first surface 41*sa* and the second surface 41*sb* of the $n^+$ semiconductor region 41 is an obtuse angle. Accordingly, a stress (for example, a tensile stress) that is applied to a portion indicated by an arrow A is further relaxed in comparison to the reference example. Accordingly, in the portion indicated by the arrow A, a defect is less likely to occur, and peeling between the portion indicated by the arrow A and the drain electrode 10 is also less likely to occur. In addition, even when the angle formed by the first surface 41*sa* and the second surface 41*sb* of the $n^+$ semiconductor region 41 is a right angle, the stress (for example, the tensile stress) that is applied to the portion indicated by the arrow A is further relaxed in comparison to the reference example.

In addition, in a case where the $n^+$ semiconductor region 41 comes into ohmic contact with the drain electrode 10, when the semiconductor device 1 is turned on, an electronic current is emitted to the drain electrode 10 also through the $n^+$ semiconductor region 41. According to this, the on-resistance of the semiconductor device 1 is reduced.

In addition, when the semiconductor device 1 is turned off, a depletion layer extends from a joint portion between the base region 30 and the source region 40 toward both the drain electrode 10 and the source electrode 11. In the semiconductor device 1, the $n^+$ semiconductor region 41 having an impurity concentration higher than that of the drift region 21 is provided between the drain electrode 10 and the base region 30. According to this, extension of the depletion layer in the drift region 21 is suppressed by the $n^+$ semiconductor region 41, and thus so-called punch-through is reliably suppressed.

In addition, the drain electrode 10 surrounds the source electrode 11. Accordingly, when the semiconductor device 1 is turned on, an electronic current that flows between the source electrode 11 and the drain electrode 10 is unlikely to locally concentrate. That is, even when the semiconductor device 1 is continuously used for a long period of time, local heat generation is unlikely to occur in the semiconductor device 1, and thus it is possible to avoid local heat damage.

In addition, the trench 20*tb* has a forward taper shape in which a width thereof becomes narrower when going toward the drain electrode 10. According to this, when forming the drain electrode 10 in the trench 20*tb*, step coverage of the drain electrode 10 is satisfactory on the sidewall surfaces of drift region 21.

(Second Embodiment)

Figure 10A:
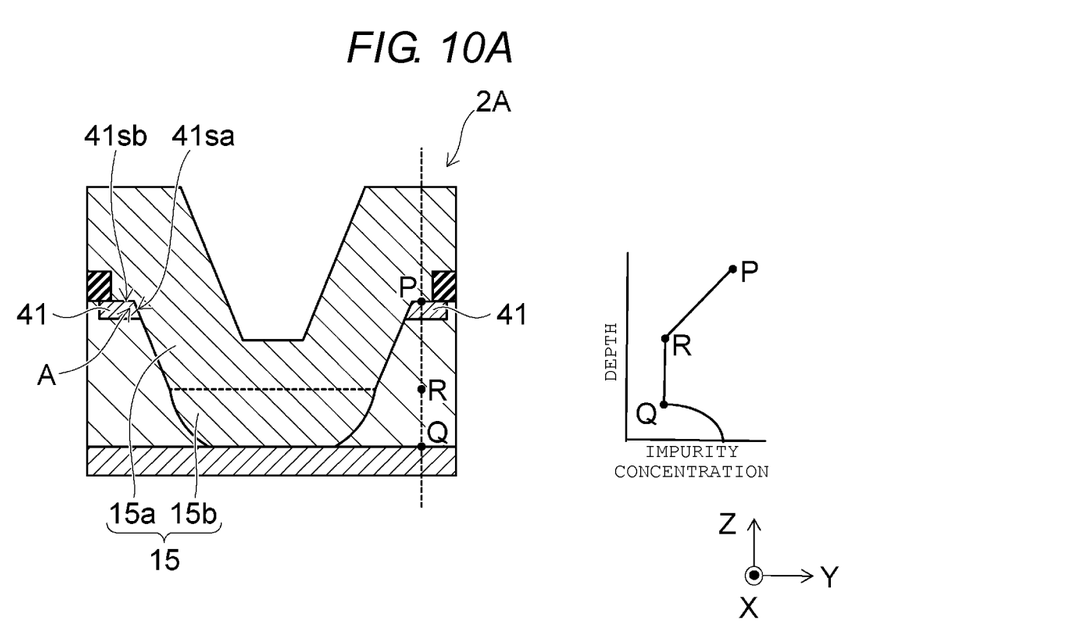
FIG. 10A is a schematic cross-sectional view illustrating a part of a semiconductor device according to a first example of a second embodiment.
Figure 10B:
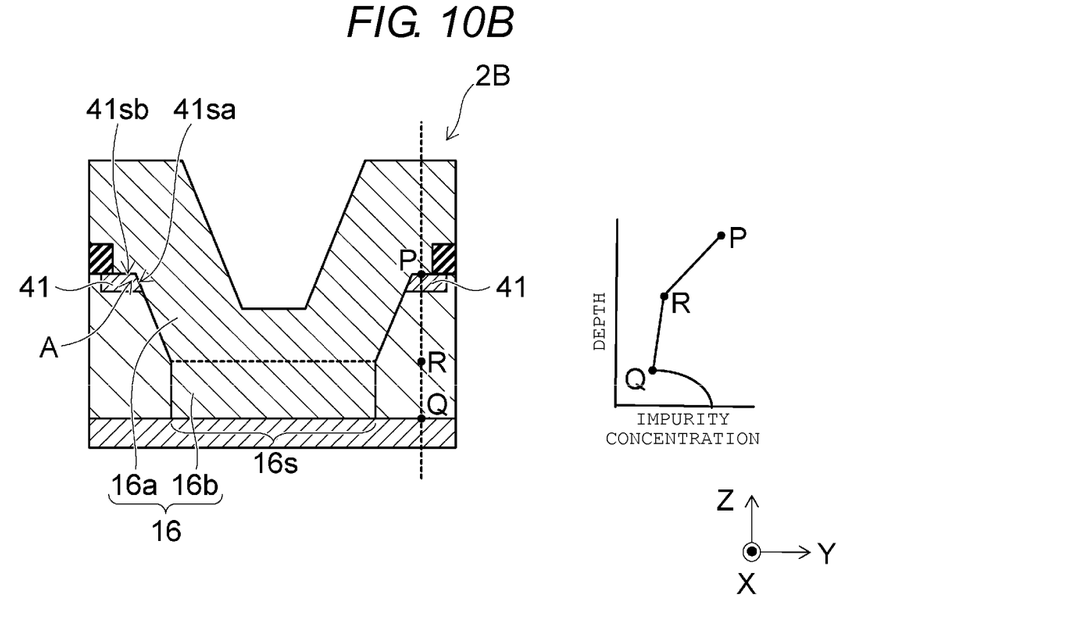
FIG. 10B is a schematic cross-sectional view illustrating a part of a semiconductor device according to second example of the second embodiment.

FIG. 10A is a schematic cross-sectional view illustrating a part of a semiconductor device according to a first example of a second embodiment, and FIG. 10B is a schematic cross-sectional view illustrating a part of a semiconductor device according to a second example of the second embodiment.

Here, FIGS. 10A and 10B are enlarged views around the vicinity of a drain electrode.

In a semiconductor device 2A illustrated in FIG. 10A, a drain electrode 15 includes a first region 15*a* and a second region 15*b*. The second region 15*b* is provided on a lower side of the first region 15*a*. A boundary between the first region 15*a* and the drift region 21 has a forward taper shape. In contrast, a boundary between the second region 15*b* and the drift region 21 is configured with a curved surface. In addition, an angle formed by the first surface 41*sa* and the second surface 41*sb* of the $n^+$ semiconductor region 41 is a right angle or an obtuse angle.

In the semiconductor device 2A, an impurity concentration between a point P and a point R continuously decreases in the Z-direction. An impurity concentration between the point R and a point Q is the substantially the same in the Z-direction. Here, a position of the point R corresponds to a position at the interface between the first region 15*a* and the second region 15*b*.

Accordingly, when a trench for formation of the drain electrode 15 is formed with the isotropic etching, a side wall of the trench has a forward taper shape from a depth of the point P to a depth of the point R. In contrast, the side wall has a curved surface from the depth of the point R to a depth of a point Q.

In the semiconductor device 2A, the angle formed by the first surface 41*sa* and the second surface 41*sb* of the $n^+$ semiconductor region 41 is also an obtuse angle or a right angle, and thus a stress that is applied to a portion indicated by an arrow A is relaxed/reduced. Accordingly, the semiconductor device 2A has the same effect as that in the semiconductor device 1.

In the semiconductor device 2B illustrated in FIG. 10B, a drain electrode 16 has a first region 16*a* and a second region 16*b*. The second region 16*b* is located at a lower side of the first region 16*a*.

Here, a boundary between the first region 16a and the drift region 21, and a boundary between the second region 16b and the drift region 21 have a forward taper shape. However, an inclination of the boundary between the second region 16b and the drift region 21 is set to be steeper (for example, substantially vertical) than an inclination of a boundary between the first region 16a and the drift region 21. In addition, an angle formed by the first surface 41sa and the second surface 41sb of the n$^+$ semiconductor region 41 is a right angle or an obtuse angle.

In the semiconductor device 2B, an impurity concentration between the point P and the point R, and an impurity concentration between the point R and the point Q continuously decrease in the Z-direction. However, a gradient between the point R and the point Q is set to be steeper than a gradient between the point P and the point R.

Accordingly, when a trench for formation of the drain electrode 16 is formed with the isotropic etching, an inclination of a boundary between the second region 16b and the drift region 21 becomes steeper than an inclination of a boundary between the first region 16a and the drift region 21.

In the semiconductor device 2B, the angle formed by the first surface 41sa and the second surface 41sb of the n$^+$ semiconductor region 41 is also an obtuse angle or a right angle, and thus a stress that is applied to a portion indicated by an arrow A is relaxed. Accordingly, the semiconductor device 2B has the same effect as that in the semiconductor device 1.

In addition, in the semiconductor device 2B, the inclination of the boundary between the second region 16b and the drift region 21 becomes steeper than the inclination of the boundary between the first region 16a and the drift region 21. Accordingly, a contact surface area 16s between the drain electrode 16 and the drain region 22 further increases in comparison to the semiconductor device 1. As a result, the on-resistance between the drain electrode 16 and the source electrode 11 further decreases in comparison to the semiconductor device 1.

In the embodiment described above, "on" in an expression such as "a portion A is on a portion B" is used to include a case where the portion A does not come into contact with the portion B and the portion A is provided above the portion B in addition to a case where the portion A comes into contact with the portion B and the portion A is provided on the portion B. Furthermore, "the portion A is on the portion B" may include a case where the portion A and the portion B are reversed and the portion A is positioned below the portion B or a case where the portion A and the portion B are horizontally provided in the same plane with each other. This is because the structure of the semiconductor device is not changed even if the semiconductor device according to the embodiment is rotated in space.

The embodiments discussed above are described with reference to the specific examples. However, the embodiments are not limited to the specific examples. That is, one skilled in the art may apply appropriate design changes to those specific examples is included in the range of the embodiments as long as it includes the characteristics of the embodiments. Each element included in the specific examples and, a disposition, a material, a condition, a shape, a size thereof, and the like is not limited to those which are illustrated above and can be appropriately changed.

Furthermore, each of the elements included in each embodiment can be combined as long as it is technically possible and the combination is included in the range of the embodiments as long as each of the elements includes the characteristics of the embodiments. In addition, in a category of the spirit of the embodiments, those skilled in the art can derive various modified examples and corrected examples, and the modified examples and the corrected examples are understood to be also included in the range of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor layer of a first-conductivity type having a first surface and a second surface opposing the first surface;
   a second semiconductor layer of the first-conductive-type on the first surface of the first semiconductor layer;
   a third semiconductor layer of a second-conductivity type on the second semiconductor layer;
   a fourth semiconductor layer of the first-conductivity type on the third semiconductor layer;
   a fifth semiconductor layer of the first-conductivity type on the second semiconductor layer;
   a first electrode on the second semiconductor layer with an insulating film located therebetween, on the third semiconductor layer with the insulating film located therebetween, and on the fourth semiconductor layer with the insulating film located therebetween;
   a second electrode on the fourth semiconductor layer; and
   a third electrode separated from the second electrode in a second direction that is crossing a first direction that is orthogonal to the second surface, wherein
   the third electrode has a third surface contacting the first surface of the first semiconductor layer and a fourth surface having a first portion contacting a side surface of the second semiconductor layer and a second portion contacting a first surface of the fifth semiconductor layer, wherein the third electrode has a width in the second direction that decreases in the first direction from a first depth to a second depth which is closer than the first depth to the first semiconductor layer,
   an angle of the side surface of the second semiconductor layer with respect to the first surface of the first semiconductor layer is greater than or equal to 90 degrees, and
   a second surface of the fifth semiconductor layer intersects the first surface of the fifth semiconductor layer and contacts the third electrode.

2. The semiconductor device according to claim 1, wherein an angle formed by the intersecting first surface of the fifth semiconductor layer and the second surface of the fifth semiconductor layer is a right angle.

3. The semiconductor device according to claim 1, wherein an angle formed by the intersecting first surface of the fifth semiconductor layer and the second surface of the fifth semiconductor layer is an obtuse angle.

4. The semiconductor device according to claim 1, wherein the fifth semiconductor layer and the fourth semiconductor layer are each disposed at a same distance from the first semiconductor layer.

5. The semiconductor device according to claim 1, wherein an impurity concentration of the fifth semiconductor layer is the same as an impurity concentration of the fourth semiconductor layer.

6. The semiconductor device according to claim 1, wherein a first-conductivity-type impurity concentration in a region including the fifth semiconductor layer and the second semiconductor layer continuously decreases in the first direction.

7. The semiconductor device according to claim 1, wherein the fifth semiconductor layer surrounds the third semiconductor layer, the fourth semiconductor layer, and the first electrode in a plane parallel to the first plane.

8. The semiconductor device according to claim 1, wherein the width of the third electrode decreases continuously from the first depth to the second depth, and the third electrode contacts a fifth semiconductor layer of the first-conductivity type at the first depth.

9. The semiconductor device according to claim 8, wherein the third electrode contacts the first semiconductor layer at the second depth.

10. The semiconductor device according to claim 8, wherein
the width of the third electrode is substantially constant from the second depth to a third depth,
the third electrode contacts the first semiconductor layer at the third depth and the second depth is between the first depth and third depth.

11. The semiconductor device according to claim 1, wherein the third electrode surrounds the third semiconductor layer, the fourth semiconductor layer, and the first electrode in a plane parallel to the first surface.

12. A semiconductor device, comprising:
a first semiconductor layer of a first-conductivity type having a first surface;
a second semiconductor layer of the first-conductivity type having a second surface contacting the first surface;
an electrode in the second semiconductor layer contacting the first surface of the first semiconductor layer and a third surface of the second semiconductor layer, the third surface having a first end contacting the first surface of the first semiconductor layer and a second end distal to the first surface; and
a third semiconductor layer having a higher impurity concentration than the second semiconductor layer, the third semiconductor layer having an upper surface contacting the electrode, a lower surface contacting the second semiconductor layer, and a side surface contacting the electrode, the third semiconductor layer being disposed between the electrode and the second end of the third surface of the second semiconductor layer, wherein
an angle between the first surface of the first semiconductor and the third surface of the second semiconductor layer is at least 90 degrees.

13. The semiconductor device according to claim 12, wherein the angle between the first surface and the third surface is greater than 90 degrees.

14. The semiconductor device according to claim 12, wherein a width of the electrode is wider at a first distance from the first surface in a direction orthogonal to the first surface than at the first surface.

15. The semiconductor device according to claim 12, wherein a portion of the electrode that is adjacent to the first semiconductor layer has a curved sidewall surface.

16. The semiconductor device according to claim 12, wherein a portion of the electrode has a constant width from the first surface to a level between the first surface and the second end of the electrode.

17. The device according to claim 12, wherein the first semiconductor layer is an n-type drain region in a MOSFET.

* * * * *